US012637108B2

(12) United States Patent　(10) Patent No.: US 12,637,108 B2
Donderici　(45) Date of Patent: May 26, 2026

(54) PRECISE PULL-OVER WITH MECHANICAL SIMULATION

(71) Applicant: GM Cruise Holdings LLC, San Francisco, CA (US)

(72) Inventor: Burkay Donderici, Burlingame, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 1024 days.

(21) Appl. No.: 17/834,810

(22) Filed: Jun. 7, 2022

(65) Prior Publication Data

US 2023/0391371 A1　Dec. 7, 2023

(51) Int. Cl.
　B60W 60/00　(2020.01)
　B60W 50/10　(2012.01)
　G06F 30/20　(2020.01)

(52) U.S. Cl.
　CPC ........ B60W 60/0016 (2020.02); B60W 50/10 (2013.01); G06F 30/20 (2020.01); B60W 2420/403 (2013.01); B60W 2420/54 (2013.01); B60W 2520/04 (2013.01); B60W 2540/041 (2020.02); B60W 2540/215 (2020.02); B60W 2554/802 (2020.02)

(58) Field of Classification Search
　CPC ............. B60W 60/0016; B60W 50/10; B60W 2420/403; B60W 2420/54; B60W 2520/04; B60W 2540/041; B60W 2540/215; B60W 2554/802; B60W 2050/0014; B60W 60/00253; G06F 30/20
See application file for complete search history.

(56) References Cited

U.S. PATENT DOCUMENTS

| | | | | |
|---|---|---|---|---|
| 2021/0003404 | A1* | 1/2021 | Zeng | G01C 21/3605 |
| 2021/0407021 | A1* | 12/2021 | Hiroi | G06Q 30/0631 |
| 2022/0406192 | A1* | 12/2022 | Butler | B62D 6/00 |
| 2022/0412754 | A1* | 12/2022 | Mourad | G08G 1/202 |

* cited by examiner

*Primary Examiner* — Chuen-Meei Gan
(74) *Attorney, Agent, or Firm* — CANTOR COLBURN LLP

(57)　ABSTRACT

Systems and methods for identifying a precise stopping location using vehicle sensors and mechanical simulation. In particular, systems and methods are provided for using vehicle sensor information to understand vehicle surroundings, identifying an appropriate stopping position that either does not disrupt traffic (or minimally disrupts traffic), and identifying a path to the stopping position. Additionally, the suitability of the stopping position is determined by performing a simulation of the vehicle movement to the stopping position as well as a simulation of passenger behavior during vehicle exit. In some examples, the simulation is performed using a short-range relative map of the vehicle surroundings rather than using the driving map. Additionally, the simulation can be performed using heuristic or data-driven models.

19 Claims, 8 Drawing Sheets

100

Sensor Suite
102

Onboard Computer  104

110

300

302
DETERMINE RELATIVE LOCATIONS OF NEARBY OBJECTS

304
IDENTIFY A STOPPING POSITION

306
PERFORM MECHANICAL SIMLUATION

308
ACCEPTABLE STOPPING POSITION?

NO

YES

310
PERFORM BEHAVIORAL SIMULATION

312
ACCEPTABLE STOPPING POSITION?

NO

YES

314
ASSIGN A SCORE TO THE STOPPING POSITION

500

600

PRECISE PULL-OVER WITH MECHANICAL SIMULATION

FIELD OF THE DISCLOSURE

The present disclosure relates generally to autonomous vehicles (AVs) and to systems and methods for augmented vehicle stops.

BACKGROUND

Autonomous vehicles, also known as self-driving cars, driverless vehicles, and robotic vehicles, are vehicles that use multiple sensors to sense the environment and move without human input. Automation technology in the autonomous vehicles enables the vehicles to drive on roadways and to accurately and quickly perceive the vehicle's environment, including obstacles, signs, and traffic lights. The vehicles can be used to pick-up passengers and drive the passengers to selected destinations. The vehicles can also be used to pick-up packages and/or other goods and deliver the packages and/or goods to selected destinations.

Autonomous vehicles can be part of an autonomous vehicle fleet that provides rides to users and/or picks up and delivers packages. When an autonomous vehicle reaches a destination, it stops for pick-up and/or drop-off of people and/or deliveries. However, stopping the vehicle on a road with other vehicles can disrupt traffic, especially in a crowded city environment. Additionally, stopping the vehicle in a moving traffic lane can cause aggravation to other drivers.

SUMMARY

Systems and methods are provided for identifying a precise stopping location using vehicle sensors and mechanical simulation. In particular, systems and methods are provided for using vehicle sensor information to understand vehicle surroundings, identifying an appropriate stopping position that either does not disrupt traffic (or minimally disrupts traffic), and identifying a path to the stopping position. Additionally, the suitability of the stopping position is determined by performing a simulation of the vehicle movement to the stopping position and passenger behavior during passenger vehicle exit. In some examples, the simulation is performed using a short-range vehicle-relative map of the vehicle surroundings. Additionally, the simulation can be performed using heuristic or data-driven models.

According to one aspect, a method for optimizing stopping location for a vehicle comprises: identifying a stopping position for the vehicle; activating a high-definition perception system to determine relative locations of nearby objects; producing a plan for reaching the stopping position; generating a first simulation of the vehicle during a stop at the stopping position, wherein the first simulation includes a vehicle door opening; generating a second simulation of a passenger during the stop at the stopping position, wherein the second simulation includes at least one of the passenger entering the vehicle through the vehicle door and the passenger exiting the vehicle through the vehicle door; and determining a score for the plan based on the first and second simulations.

In some implementations, the plan is a first plan, and the score is a first score, and the method includes producing a second plan for reaching the stopping position; generating a third simulation of the vehicle during a stop at the stopping position; generating a fourth simulation of the passenger during a stop at the stopping position; and determining a second score for the second plan based on the third and fourth simulations.

In some implementations, the method includes comparing the first and second scores and identifying a selected plan of the first and second plans based on the first and second scores. In some implementations, the method includes presenting the selected plan to the passenger, receiving passenger approval of the selected plan, and operating based on the selected plan. In some implementations, the method includes presenting the selected plan to the passenger, receiving passenger rejection of the selected plan, and identifying a different plan of the first and second plans.

In some implementations, activating the high-definition perception system includes generating a high-definition model of the nearby objects. In some implementations, generating the high-definition model includes producing a three-dimensional cloud of points and producing semantic information for the three-dimensional cloud of points. In some implementations, generating the high-definition model includes producing a three-dimensional depth image. In some implementations, the method includes collecting temporal data and enhancing the three-dimensional depth image using the temporal data. In some implementations, activating the high-definition perception system includes activating short-range sensors. In some implementations, generating the first simulation further includes simulating the vehicle decelerating towards the stopping location.

According to another aspect, a system for optimizing vehicle stopping location comprises: a central computer to transmit map data; and a vehicle including: a sensor suite including external vehicle sensors to sense a vehicle environment and generate sensor data; a high-definition perception system to determine relative locations of nearby objects; an onboard computer to receive map data from the central computer, to identify a stopping position for the vehicle, and to generate a plan for the vehicle to drive to the stopping position, wherein the plan is based in part on the relative locations of nearby objects; and a simulation system to: generate a first simulation of the vehicle during a stop at the stopping position, wherein the first simulation includes a vehicle door opening; generate a second simulation of a passenger during the stop at the stopping position; and wherein the onboard computer is to determine a score for the plan based on the first and second simulations.

In some implementations, the high-definition perception system includes short-range sensors. In some implementations, the short-range sensors are ultrasound sensors. In some implementations, the high-definition perception system is to generate a high accuracy short-range vehicle-relative map including a high-definition model of the nearby objects and wherein the simulation system is to use the high accuracy short-range vehicle-relative map and the high-definition model to generate the first and second simulations. In some implementations, activating the high-definition perception system includes generating a high-definition model of the nearby objects. In some implementations, the high-definition perception system includes a neural network.

According to another aspect, a method for optimizing stopping location for a vehicle, comprises: identifying a stopping position for the vehicle; activating a high-definition perception system to determine relative locations of nearby objects; producing a plan for reaching the stopping position; generating a first simulation of the vehicle during a stop at the stopping position, wherein the first simulation includes a vehicle door opening; generating a second simulation of a user during a stop at the stopping position, wherein the second simulation includes at least one of the user opening the vehicle door to drop off a delivery and the user opening the vehicle door to pick up a delivery; and determining a score for the plan based on the first and second simulations.

In some implementations, the plan is a first plan, and the score is a first score, and the method further includes: producing a second plan for reaching the stopping position; generating a third simulation of the vehicle during a stop at the stopping position; generating a fourth simulation of the user during a stop at the stopping position; and determining a second score for the second plan based on the third and fourth simulations. In some implementations, the method further includes comparing the first and second scores and identifying a selected plan of the first and second plans based on the first and second scores.

According to another aspect, a method for optimizing stopping location for a vehicle, comprises identifying a stopping position for the vehicle; activating a perception system to determine relative locations of nearby objects; generating a first simulation of the vehicle during a stop at the stopping position, wherein the first simulation includes a first vehicle door opening and one of a user entering the vehicle through the first vehicle door and the user exiting the vehicle through the first vehicle door; generating a second simulation of the vehicle during the stop at the stopping position, wherein the second simulation includes a second vehicle door opening and one of the user entering the vehicle through the second vehicle door and the user exiting the vehicle through the second vehicle door; and determining a first score for the first simulation and a second score for the second simulation.

In some implementations, the method includes comparing the first and second scores and identifying a selected plan for the user based on the first and second scores. In some implementations, the first and second vehicle doors are on opposite sides of the vehicle.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Figure 1:
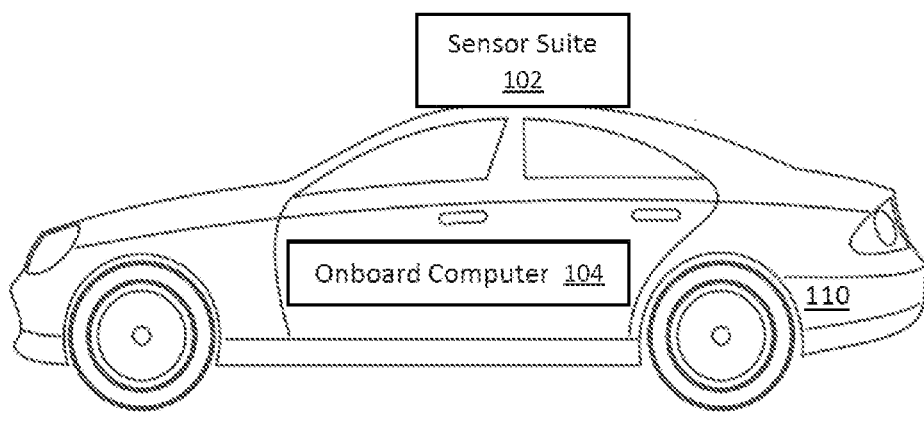
FIG. 1 is a diagram illustrating an autonomous vehicle, according to some embodiments of the disclosure.

Systems and methods are provided herein for identifying a precise stopping location using vehicle sensors and mechanical simulation. In particular, systems and methods are provided for using vehicle sensor information to understand vehicle surroundings, identifying an appropriate stopping position that either does not disrupt traffic (or minimally disrupts traffic), and identifying a path to the stopping position. Additionally, the suitability of the stopping position is determined by performing a simulation of the vehicle movement to the stopping position as well as a simulation of passenger behavior during vehicle exit. In some examples, the simulation is performed using a short-range relative map of the vehicle surroundings rather than using the driving map. Additionally, the simulation can be performed using heuristic or data-driven models.

In various implementations, the stopping position of an autonomous vehicle for pick-up and drop-off is determined using a combination of high accuracy localization with physical and behavioral simulation of the passenger during the pick-up and/or drop-off. To optimize the vehicle stopping position, movement of active parts of the vehicle, such as the vehicle door, are simulated using mechanical simulation or other heuristics. In some examples, neural networks are used to produce pixel-by-pixel information to accurately determine the shapes of nearby objects using sensor data such as camera sensor data, LIDAR sensor data, and ultrasound sensor data. Sensor fusion can be used to generate accurate shape information. For example, camera depth information may be calibrated to the depth from LIDAR or ultrasonic sensors. The calibration can be performed by shifting the depth shapes until a match between different sensors is achieved. When performing sensor fusion, uncertainty in sensor data for each sensor may be taken into consideration. For example, camera depth information is not very accurate, while LIDAR or ultrasonic sensor data depth information is accurate. As another example, LIDAR may have blind spots, while surround camera may see the objects that are in the blind spots. In various examples, sensor fusion can produce an image that takes the available and accurate information from each sensor to produce one best image. In various examples, the simulation is performed in a high accuracy autonomous vehicle-relative map, rather than in the absolute coordinate system of the driving area map generally used by the vehicle while driving.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Example Autonomous Vehicle Configured for Precise Pull-Over with Simulation

FIG. 1 is a diagram of an autonomous driving system 100 illustrating an autonomous vehicle 110, according to some embodiments of the disclosure. The autonomous vehicle 110 includes a sensor suite 102 and an onboard computer 104. In various implementations, the autonomous vehicle 110 uses sensor information from the sensor suite 102 to determine its location, to navigate traffic, to sense and avoid obstacles, and to sense its surroundings. According to various implementations, the autonomous vehicle 110 is part of a fleet of vehicles for picking up passengers and/or packages and driving to selected destinations. The autonomous vehicle 110 includes systems and methods for determining precise vehicle pull-over locations using simulation.

The sensor suite 102 includes localization and driving sensors. For example, the sensor suite may include one or more of photodetectors, cameras, radio detection and ranging (RADAR), sound navigation and ranging (SONAR), light detection and ranging (LIDAR), GPS, inertial measurement units (IMUs), accelerometers, microphones, strain gauges, pressure monitors, barometers, thermometers, altimeters, wheel speed sensors, and a computer vision system. The sensor suite 102 continuously monitors the autonomous vehicle's environment. In some examples, data from the sensor suite 102 can be used to update a map with information used to develop layers with waypoints identifying various detected items. In some examples, data from the sensor suite 102 can include information regarding crowds and/or lines outside and/or around selected venues. The data and map waypoints can be used by the vehicle to identify a pull-over location and generate one or more simulations of the pull-over. Additionally, sensor suite 102 data can provide localized traffic information. In this way, sensor suite 102 data from many autonomous vehicles can continually provide feedback to the mapping system and the high fidelity map can be updated as more and more information is gathered. This information can be used by the vehicle as well as by other vehicles in a vehicle fleet in identifying pull-over locations. In some examples, the pull-over determination and simulation systems provided herein can use information gathered by other autonomous vehicles in the fleet, for example information in the mapping system, for updating pull-over locations and simulations as described in greater detail below.

In various examples, the sensor suite 102 includes cameras implemented using high-resolution imagers with fixed mounting and field of view. In further examples, the sensor suite 102 includes LIDARs implemented using scanning LIDARs. Scanning LIDARs have a dynamically configurable field of view that provides a point-cloud of the region intended to scan. In still further examples, the sensor suite 102 includes RADARs implemented using scanning RADARs with dynamically configurable field of view. In some examples, the sensor suite 102 includes ultrasound imagers. In various examples, the sensor suite 102 sensors can be used to identify one or more pull-over locations and/or stopping locations.

The autonomous vehicle 110 includes an onboard computer 104, which functions to control the autonomous vehicle 110. The onboard computer 104 processes sensed data from the sensor suite 102 and/or other sensors, in order to determine a state of the autonomous vehicle 110. In some examples, an onboard simulation system receives processed sensed sensor suite 102 data from the onboard computer 104. In some examples, the onboard simulation system receives sensor suite 102 data from the sensor suite 102. In some implementations described herein, the autonomous vehicle 110 includes sensors inside the vehicle. In some examples, the autonomous vehicle 110 includes one or more cameras inside the vehicle. The cameras can be used to detect items or people inside the vehicle. In some examples, the autonomous vehicle 110 includes one or more weight sensors inside the vehicle, which can be used to detect items or people inside the vehicle. In some examples, the interior sensors can be used to detect passengers inside the vehicle. Based upon the vehicle state and programmed instructions, the onboard computer 104 controls and/or modifies driving behavior of the autonomous vehicle 110.

The onboard computer 104 functions to control the operations and functionality of the autonomous vehicle 110 and processes sensed data from the sensor suite 102 and/or other sensors in order to determine states of the autonomous vehicle. In some implementations, the onboard computer 104 is a general-purpose computer adapted for I/O communication with vehicle control systems and sensor systems. In some implementations, the onboard computer 104 is any suitable computing device. In some implementations, the onboard computer 104 is connected to the Internet via a wireless connection (e.g., via a cellular data connection). In some examples, the onboard computer 104 is coupled to any number of wireless or wired communication systems. In some examples, the onboard computer 104 is coupled to one or more communication systems via a mesh network of devices, such as a mesh network formed by autonomous vehicles.

According to various implementations, the autonomous driving system 100 of FIG. 1 functions to enable an autonomous vehicle 110 to modify and/or set a driving behavior in response to parameters set by vehicle passengers (e.g., via a passenger interface). In some examples, as described in greater detail below, the autonomous vehicle 110 driving behavior is modified based on an identified stopping location. Driving behavior of an autonomous vehicle may be modified according to explicit input or feedback (e.g., a passenger specifying a maximum speed or a relative comfort level), implicit input or feedback (e.g., a passenger's heart rate), or any other suitable data or manner of communicating driving behavior preferences.

The autonomous vehicle 110 is preferably a fully autonomous automobile, but may additionally or alternatively be any semi-autonomous or fully autonomous vehicle. In various examples, the autonomous vehicle 110 is a boat, an unmanned aerial vehicle, a driverless car, a golf cart, a truck, a van, a recreational vehicle, a train, a tram, a three-wheeled vehicle, a bicycle, or a scooter. Additionally, or alternatively, the autonomous vehicles may be vehicles that switch between a semi-autonomous state and a fully autonomous state and thus, some autonomous vehicles may have attributes of both a semi-autonomous vehicle and a fully autonomous vehicle depending on the state of the vehicle.

In various implementations, the autonomous vehicle 110 includes a throttle interface that controls an engine throttle, motor speed (e.g., rotational speed of electric motor), or any other movement-enabling mechanism. In various implementations, the autonomous vehicle 110 includes a brake interface that controls brakes of the autonomous vehicle 110 and controls any other movement-retarding mechanism of the autonomous vehicle 110. In various implementations, the autonomous vehicle 110 includes a steering interface that controls steering of the autonomous vehicle 110. In one example, the steering interface changes the angle of wheels of the autonomous vehicle. The autonomous vehicle 110 may additionally or alternatively include interfaces for control of any other vehicle functions, for example, windshield wipers, headlights, turn indicators, air conditioning, etc.

Example Methods for Autonomous Vehicle
Pull-over Location Identification

Figure 2:
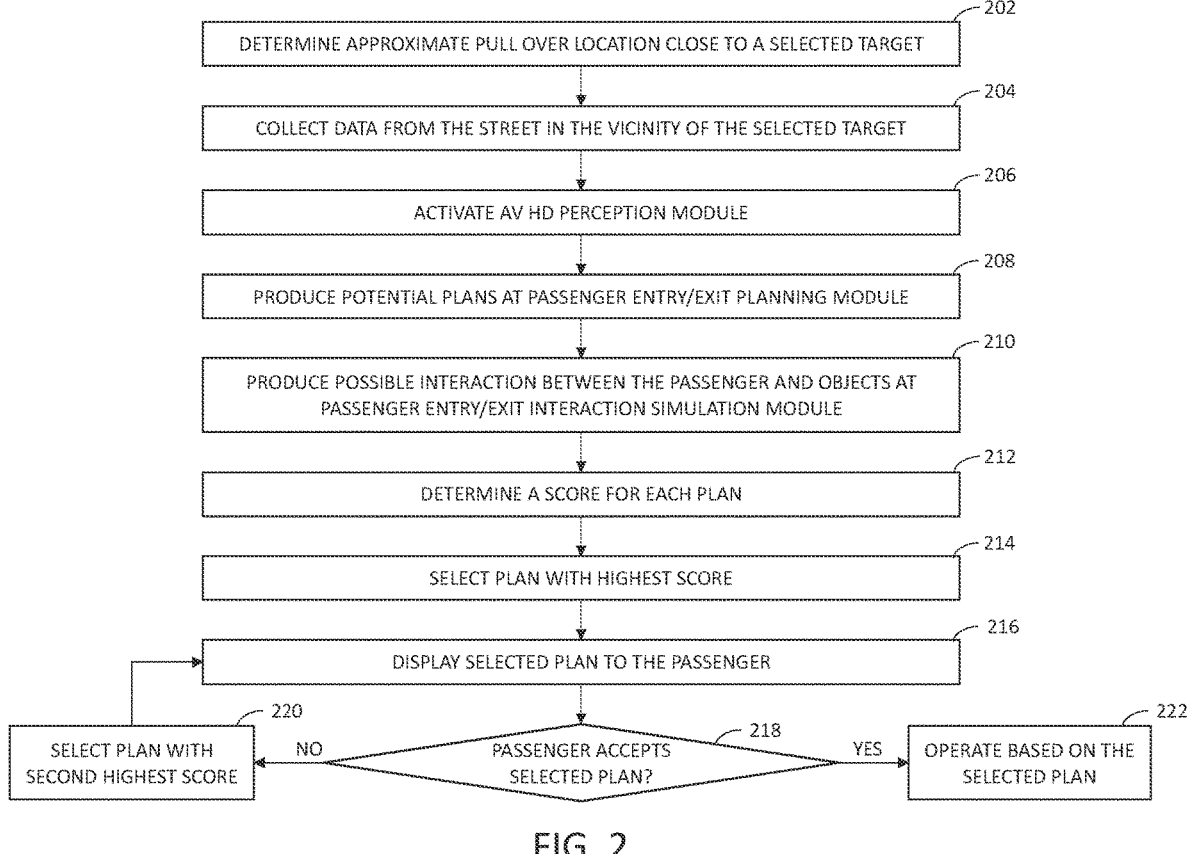
FIG. 2 is a flow chart illustrating a method for vehicle pull-over location determination, according to some embodiments of the disclosure.

FIG. 2 is a flow chart illustrating a method 200 for vehicle pull-over location determination, according to various embodiments of the disclosure. At step 202, the vehicle determines an approximate pull-over location close to a selected target. In various examples, the selected target can be a pick-up or drop-off location entered in the ride request, the selected target can be an intermediate stopping location entered in the initial ride request and/or added after pick-up, and/or the selected target can be a pick-up and/or drop-off location for a delivery request. The selected target may be a point in space, a line segment, and/or an area. For example, the ride request may specify drop off in front of a building but without specifying the precise location. The selected target may also come with a temporal constraint. For example, the ride request (or delivery request) can include a desired drop-off time, such that the drop-off is to take place at a precise time. When a desired drop-off time is included in the request, the target time is taken into consideration when generating the score for each drop-off plan.

At step 204, data is collected from the street in the vicinity of the selected target. In some examples, the vehicle is on the street in the vicinity of the selected target, and the vehicle collects data. For example, once the selected target is identified, the sensor suite on the vehicle can collect data regarding the collected target. The data can include position and shape of other objects and the amount of space available at the pull-over location, and information about other road users (vehicles, pedestrians, etc.) at or near the pull-over location. In some examples, the data include identifying anything that is located at or near the selected target that may prevent the vehicle from stopping and/or pulling over at or near the approximate pull-over location. In various examples, one or more other road users may be blocking some or all of the pull-over location, the pull-over location may be closed off with signs, cones, or other indicators, and/or road debris may be blocking some or all of the pull-over location. Road users can include other vehicles, including both motorized and non-motorized vehicles, such as cars, trucks, bicycles, skateboards, scooters, and the like, as well as pedestrians, and anything else that is using the road.

In some examples, the data collected at step 204 is collected from sources other than the vehicle. For example, a second vehicle on the street can collect data in the vicinity of the selected target. In other examples, there can be sensors located on the street in the vicinity of the selected target that collect data. For instance, there may be sensors attached to local buildings or traffic lights. In various examples, collected data from other vehicles or sensors is transmitted to a central computer, and the central computer can transmit the data to the vehicle identifying a pull-over location.

At step 206, when the vehicle is in the vicinity of the selected target, the vehicle's high-definition perception module is activated. In some examples, the high-definition perception module generates a high-resolution image in the vicinity of the target. In some examples, the high-definition perception module generates a high-resolution mapping in the vicinity of the selected target. In some examples, the high-definition perception module focuses on the area between the vehicle and the selected target. In some examples, the high-definition perception module uses sensor data from the vehicle sensor suite, as well as other sensors positioned on the vehicle, to create a high-definition mapping of vicinity of the selected target, including anything on or next to the road between the vehicle and the selected target. In some examples, the high-definition perception module uses sensor data from the vehicle sensor suite, as well as other sensors positioned on the vehicle, to create a high-definition mapping of vicinity of the selected target, including anything on or next to the road between the vehicle and the approximate pull-over location identified in step 202.

The high-definition perception module produces a high-definition model of the objects in the vicinity of the selected target. In some examples, the high-definition model includes a large number of boxes with semantic information for each box. In some examples, the high-definition model is a three-dimensional (3D) cloud of points and includes the semantic information for each point. In some examples, the high-definition model is a 3D depth image. In some examples, the high-definition perception module uses temporal data for enhanced 3D information. In some examples, the vehicle uses a neural network to determine a precise relative location and shape of objects with respect to the vehicle. The neural network can be a deep neural network.

At step 208, potential plans are produced at a passenger entry/exit interaction planning module. The plans can include opening of the vehicle door, including the spatial location of the vehicle door opening, and the timing of the door opening. The plans can include a passenger entering and/or exiting the vehicle, including the spatial location of the passenger during entry and/or exit, and the timing of the entry and/or exit. For instance, the plans can include the spatial location of the passenger during the time the passenger is expected to be within a certain distance of the vehicle (e.g., within about three feet of the vehicle), and/or the spatial location of the passenger during a certain time period (e.g., while the vehicle door is open, or a few seconds before and/or after the door is opened). The plans can include a passenger's behavioral characteristics such as passenger speed and manner in exiting the vehicle. The plans can include giving the passenger a visual or audio cue about how they should exit the vehicle. For example, the cue may be about being slower, faster, or careful about certain type of hazards such as wet surface or approaching bikes or pedestrians.

In various examples, the potential plans produced at the passenger entry/exit interaction planning module can include the vehicle slowing down and the vehicle stopping, including the spatial location of the deceleration and/or stopping, and the timing of the deceleration and/or stopping. The plans can include the vehicle slowly creeping forward and/or backward, including the spatial location of the forward and/or backward movement, and the timing of the forward and/or backward movement. The plans can include determining an ideal stopping location. Additionally, the plans can include rules and/or constraints that codify local regulations on stopping vehicles.

At step 210, a passenger entry/exit interaction simulation module produces a possible interactions between the passenger and detected objects. The simulation includes a physical simulation of the opening and/or closing of the vehicle door. In some examples, the simulation includes a physical simulation of a passenger entering and/or exiting the vehicle. In some examples, the simulation includes a physical simulation of a passenger moving to and/or from a selected seat within the vehicle. In some examples, the simulation includes a physical simulation of a passenger moving from and/or to a pedestrian walkway. In some examples, the simulation includes a collection of heuristic rules about what kind of situation leads to which kind of outcome.

At step 212, a score is determined for each plan produced at steps 208 and 210. In some examples, the score includes a comfort score for the passenger. In some examples, the score includes a comfort score for other road users, including pedestrians and other vehicles. In some examples, the score accounts for the occupancy of parked vehicles on the road. In some examples, the score includes a passenger experience score which takes into consideration passenger wellbeing. In some examples, the score includes an experience score for nearby pedestrians, in particular for pedestrians who are expected to interact with the passenger. In some examples, the score includes a wellbeing score for the vehicle. The wellbeing score for the vehicle can be designed to minimize the chance that the vehicle may get dinged or scratched (e.g., a vehicle door hitting a lamp post upon opening). In some examples, the score includes feedback from the passenger regarding a passenger preference for entering and/or exiting the vehicle. For instance, a passenger may prefer to exit from a selected vehicle door to avoid having to climb over another passenger and/or to avoid another passenger having to move.

At step 214, the pull-over location plan with the highest score is selected. At step 216, the selected plan is displayed to the passenger. In some examples, the selected plan is displayed to the passenger via a passenger mobile device. In some examples, the passenger is in the vehicle, and the selected plan is displayed to the passenger via a display screen and/or tablet in the vehicle. In some examples, multiple plans may be displayed to the user, and the user selects among the displayed plans. In some examples, any potential hazards for each plan is indicated with the displayed plan. For example, if one option would lead to the passenger exiting the vehicle on top of a shallow pool of water, this is indicated as a hazard on the display.

At step 218, it is determined whether the passenger accepted the selected plan. If the passenger accepts the plan at step 218, the method 200 proceeds to step 222, and the vehicle operates based on the selected plan. If the passenger rejects the selected plan at step 218, in some examples, the method 200 proceeds to step 220, and the plan with the second highest score is selected. From step 220, the method 200 returns to step 216 and the selected plan is displayed to the passenger. In some examples, when a passenger rejects the selected plan at step 218, the passenger has an option to propose an alternative plan. In various implementations, when a passenger proposes an alternative plan, the method returns to step 210 and the passenger entry/exit interaction simulation module produces possible interactions between the passenger and detected objects. However, if the passenger entry/exit interaction simulation module determines that the proposed passenger plan is acceptable, the method can proceed to step 222 and operate based on the proposed passenger plan. In some examples, a new set of options may be displayed to the user.

Figure 3:
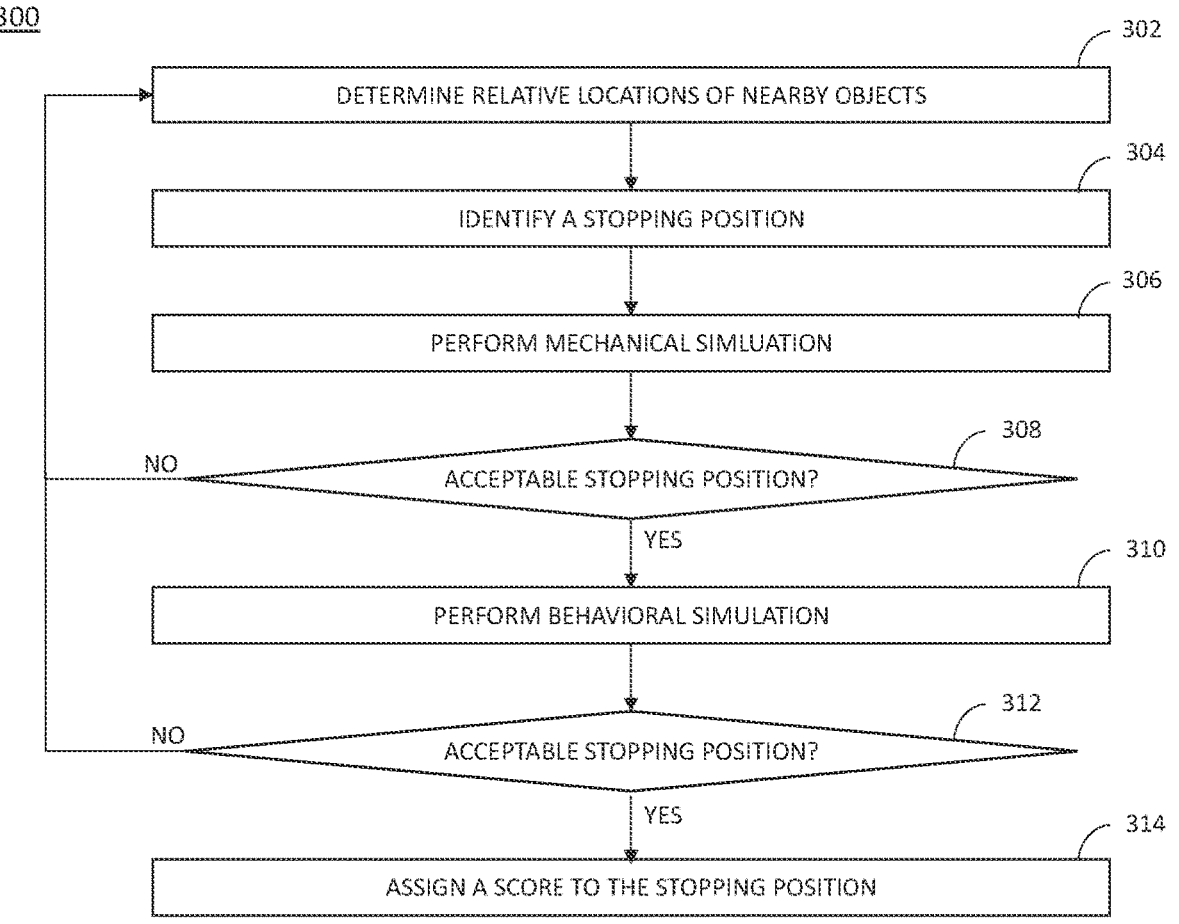
FIG. 3 is a flow chart illustrating a method for identifying a vehicle pull-over location, according to some embodiments of the disclosure.

FIG. 3 is a flow chart illustrating a method 300 for identifying a vehicle pull-over location, according to various embodiments of the disclosure. In some examples, the method 300 of FIG. 3 is a method for evaluating a single pull-over plan, and the method 300 can be repeated for multiple potential pull-over plans. In some examples, as described above with respect to FIG. 2, each pull-over plan can be assigned a score. Various steps of the method 300 can be performed in different order from what is shown in FIG.

3. For example, steps 308 and 310 can be performed concurrently in a single simulation.

According to various implementations, the method 300 begins when a vehicle nears a destination location, such as a pick-up location, a drop-off location, and/or an intermediate stopping location. At step 302, the locations of various nearby objects are determined. For example, the locations of nearby road users, any road hazards, and objects at the side of the road. At step 304, a stopping location for the vehicle is identified. As discussed above with respect to FIG. 2, the stopping location is in the vicinity of a selected target or destination location.

At step 306, the vehicle performs a mechanical simulation of the identified stopping position. The mechanical simulation can include a simulation of vehicle movement to the stopping position, and movement of vehicle parts (e.g., opening of vehicle doors or trunk) during the stop. Based on the mechanical simulation, at step 308, it is determined whether the identified stopping position is acceptable. This can include ensuring that the vehicle can reach the stopping position and move sufficiently out of the way of traffic. Additionally, determining whether the identified stopping position is acceptable can include ensuring that a vehicle door has space to be opened at the stopping position, and/or ensuring that a vehicle door isn't likely to hit something when opened. If the identified stopping position is not acceptable at step 308, the method returns to step 302. If the identified stopping position is acceptable at step 308, the method proceeds to step 310.

At step 310, a behavioral simulation is performed. The behavioral simulation can include a simulation of passenger behavior while entering and/or exiting the vehicle. In some examples, the behavioral simulation and the mechanical simulation are performed simultaneously. The behavioral simulation can include a simulation of passenger behavior while dropping off a delivery and/or picking up a delivery. The behavioral simulation can include a simulation of other road users during the stop, as well as during a period of time before and/or after the stop. The behavioral simulation can include a simulation of nearby pedestrians during the stop, as well as during a period of time before and/or after the stop. At step 312, it is determined whether the identified stopping position is acceptable based on the behavioral simulation at step 310. If the identified stopping position is not acceptable the method returns to step 302. If the identified stopping position is acceptable, the method proceeds to step 314 and assigns a score to the stopping position. In various implementations, the method 300 is performed for multiple potential stopping positions, and each stopping position is assigned a score. As discussed above with respect to FIG. 2, the stopping position with the highest score can be presented to the user. In other implementations, other factors are considered in determining which stopping position to present to the user.

Example Diagram for Autonomous Vehicle Pull-over Location Identification

Figure 4A:
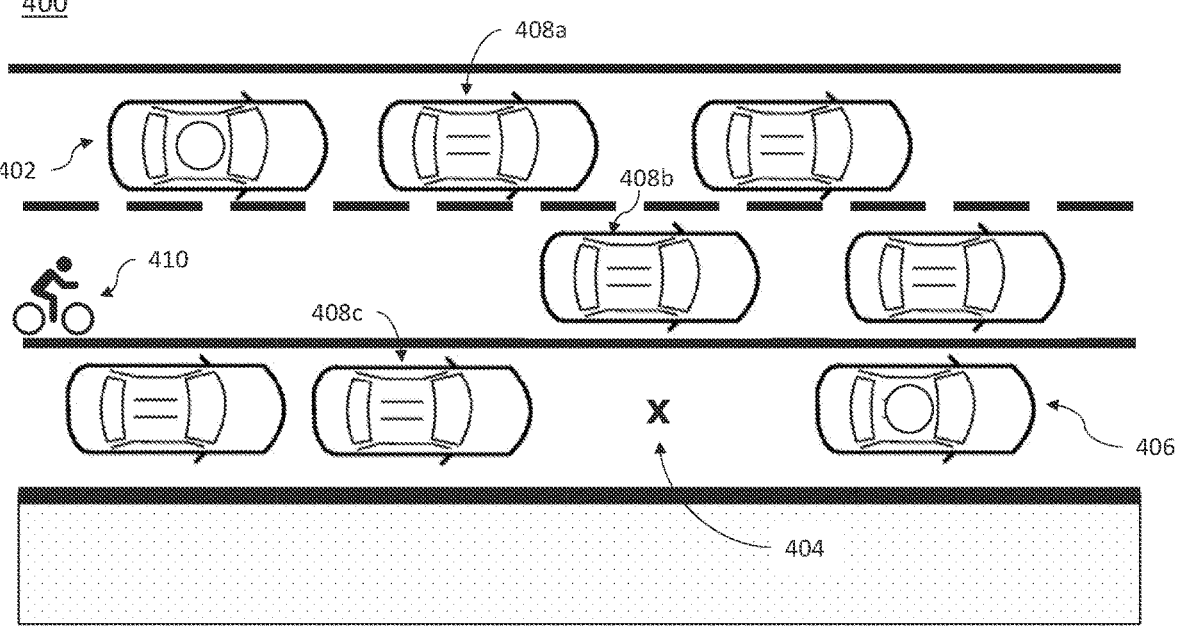
FIGS. 4A and 4B are diagrams illustrating vehicle pull-over location determination, according to some embodiments of the disclosure.
Figure 4B:
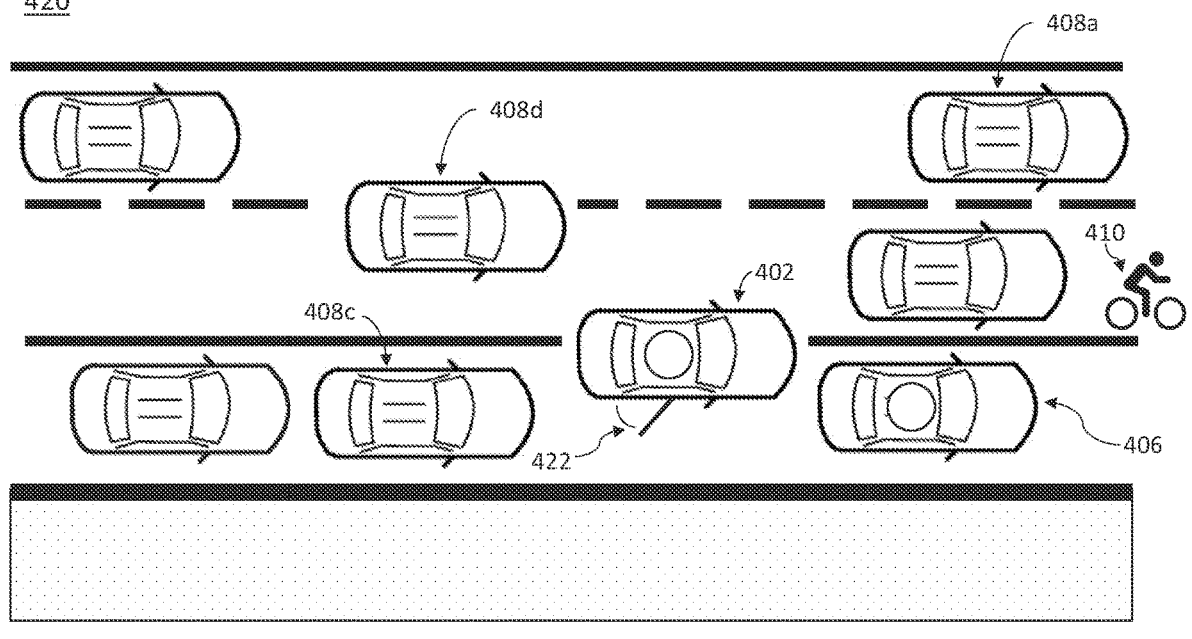

FIGS. 4A and 4B are diagrams illustrating vehicle pull-over location determination, according to various embodiments of the disclosure. In particular, FIG. 4A illustrates a vehicle 402 that has identified a pull-over location as shown by the "x" 404. According to various examples, the pull-over location 404 is close to a selected target, which may be at the side of the road (bottom of FIG. 4A). As described with respect to the methods 200, 300 in FIGS. 2 and 3, respectively, in determining whether the pull-over location 404 is an acceptable pull-over location, the vehicle 402 collects data from the street on which it is driving. The data can include information about other vehicles on the road, such as the vehicles 408a and 408b that are driving just ahead of the vehicle 402. The data can also include data about vehicles parked along the side of the road, especially those close to the pull-over location 404, such as the vehicle 408c and the vehicle 406. Additionally, the data can include information about the bicyclist 410, since the vehicle 402 will likely need to allow the bicyclist 410 to pass before the vehicle 402 can reach the pull-over location 404.

The vehicle 402 activates a high-definition perception module to process the data regarding other road users and objects. The vehicle 402 then produces a plan to reach the pull-over location 404, and simulates the plan using a simulation module. The simulation includes movement of the other road users, 408a, 408b, 410, as well as movement of the vehicle 402. In some examples, the simulation includes movement of one or both of the parked vehicles 408c and 406.

FIG. 4B shows one potential simulation in which the vehicle 402 reaches the pull-over location 404. The simulation proceeds to generate a plan regarding a vehicle door opening 412, as well as a passenger entering or exiting. In FIG. 4B, the vehicle 402 is shown pulled over close to the side of the road, but not fully pulled out of the lane of traffic. As such, the vehicle 408d has to move into the left lane to drive around the vehicle 402. In other simulations, the vehicle 402 may have pulled over completely into the pull-over location 404.

According to some implementations, the vehicle 406 also includes a sensor suite. In some examples, the vehicle 406 provides sensor data to the vehicle 402. This can include data regarding other road users, road hazards, pedestrians, or other sensor data. In various examples, collected data from the vehicle 406 is transmitted to a central computer, and the central computer can transmit the data to the vehicle 402 identifying a pull-over location. In some examples, the vehicle 406 can transmit data directly to the vehicle 402.

In some examples, map data can be used by a vehicle in determining a pull-over location. According to various implementations, map data includes high precision map data. In some examples, high precision maps include layers of information in addition to roadway maps and can be used for routing and directing autonomous vehicles. The layers of information can include data about objects visible from roadways, such as buildings, landmarks, signs, traffic lights, hydrants, roadwork, parked vehicles, etc. The layers of information can also include, for example, expected traffic patterns and/or traffic density at various times of day and on various days of the week. When autonomous vehicles travel around an area, the autonomous vehicles record and provide feedback on the surrounding environment to a central computer. The high precision map is updated to include current environment data, and the updated high precision map can be used by other autonomous vehicles. Autonomous vehicles can also record and provide feedback on events that are encountered, such as roadwork, including where and when the events are encountered. The high precision maps can include a layer marking waypoints for various events. Data analysis from previous autonomous vehicle routes can also determine timeframes during which selected events are more likely to occur in selected locations and these locations and times can be included as identified waypoints for test vehicle routing. In some examples, map data is used to identify potential pull-over locations, and in some examples, map data is used to rule out potential pull-over locations.

Example of Autonomous Vehicle Fleet

Figure 5:
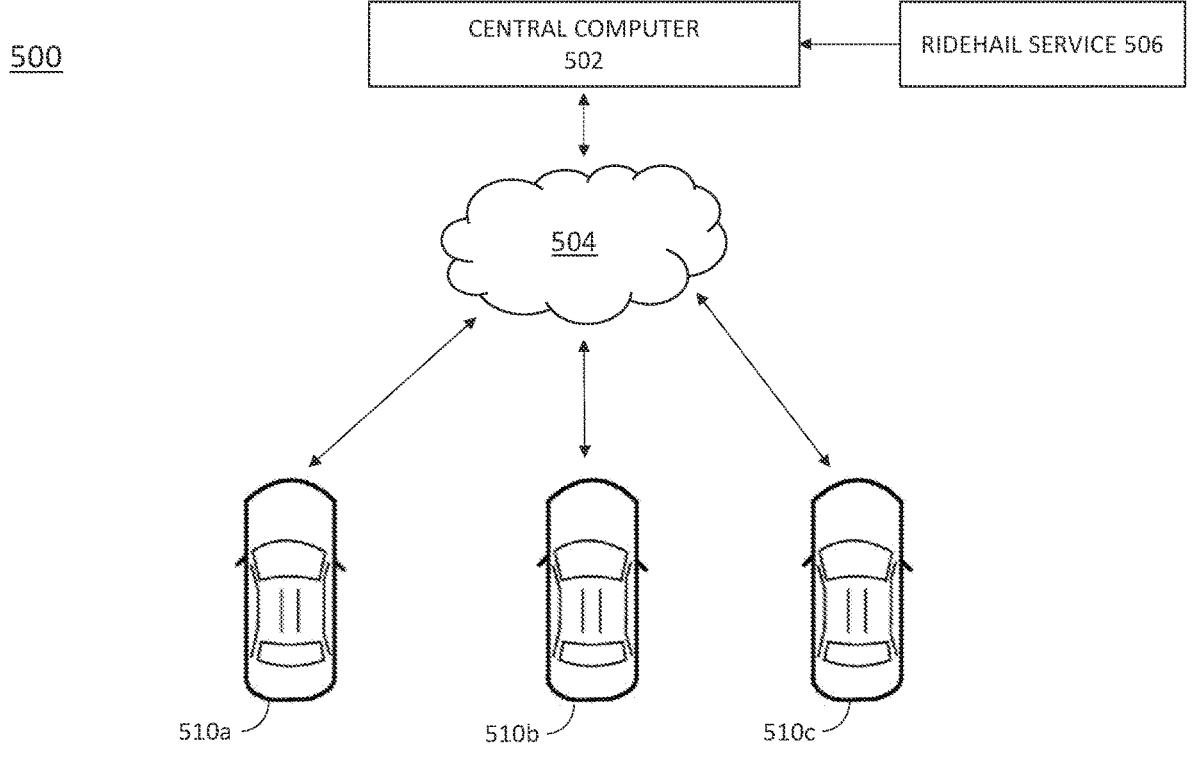
FIG. 5 is a diagram illustrating a fleet of autonomous vehicles in communication with a central computer, according to some embodiments of the disclosure.

FIG. 5 is a diagram 500 illustrating a fleet of autonomous vehicles 510a, 510b, 510c in communication with a central computer 502, according to some embodiments of the disclosure. The vehicles 510a-510c communicate wirelessly with a cloud 504 and a central computer 502. The central computer 502 includes a routing coordinator and a database of information from the vehicles 510a-510c in the fleet. Autonomous vehicle fleet routing refers to the routing of multiple vehicles in a fleet. The central computer also acts as a centralized ride management system and communicates with ridehail users via a ridehail service 506. In various examples, the ridehail service 506 includes a rideshare service (and rideshare users) as well as an autonomous vehicle delivery service. Via the ridehail service 506, the central computer receives ride requests from various user ridehail applications. In some implementations, the ride requests include a pick-up location, a drop-off location, and/or a stopping location. In some examples, a ridehail service 506 can provide users with pull-over location options, as described above with respect to FIG. 2. In some implementations, the autonomous vehicles 510a-510c communicate directly with each other.

When a ride request is entered at a ridehail service 506, the ridehail service 506 sends the request to the central computer 502. If the ridehail request is for a future date, the central computer 502 stores the information for future routing determinations. In some examples, on the day of the ride request, during a selected period of time before the ride begins, the vehicle to fulfill the request is selected and route for the vehicle is generated by the routing coordinator. In other examples, the vehicle to fulfill the request is selected and the route for the vehicle is generated by the onboard computer on the autonomous vehicle. In various examples, information pertaining to the ride is transmitted to the selected vehicle 510a-510c. With shared rides, the route for the vehicle can depend on other passenger pick-up and drop-off locations. Each of the autonomous vehicles 510a, 510b, 510c in the fleet are equipped to provide determine a pull-over location using simulation modules as described above with respect to FIGS. 2-4A. The vehicles 510a, 510b, 510c communicate with the central computer 502 via the cloud 504.

As described above, each vehicle 510a-510c in the fleet of vehicles communicates with a routing coordinator. Thus, information gathered by various autonomous vehicles 510a-510c in the fleet can be saved and used to generate information for future routing determinations. For example, sensor data can be used to generate route determination parameters. In general, the information collected from the vehicles in the fleet can be used for route generation or to modify existing routes. In some examples, the routing coordinator collects and processes position data from multiple autonomous vehicles in real-time to avoid traffic and generate a fastest-time route for each autonomous vehicle. In some implementations, the routing coordinator uses collected position data to generate a best route for an autonomous vehicle in view of one or more traveling preferences and/or routing goals. In some examples, the routing coordinator uses collected position data corresponding to emergency events to generate a best route for an autonomous vehicle to avoid a potential emergency situation and associated unknowns. Similarly, a vehicle can use collected position data corresponding to emergency events to avoid attempting to identify pull-over locations in emergency event areas.

According to various implementations, a set of parameters can be established that determine which metrics are considered (and to what extent) in determining routes or route modifications. For example, expected congestion or traffic based on a known event can be considered. Generally, a routing goal refers to, but is not limited to, one or more desired attributes of a routing plan indicated by at least one of an administrator of a routing server and a user of the autonomous vehicle. The desired attributes may relate to a desired duration of a route plan, a comfort level of the route plan, a vehicle type for a route plan, safety of the route plan, and the like. For example, a routing goal may include time of an individual trip for an individual autonomous vehicle to be minimized, subject to other constraints. As another example, a routing goal may be that comfort of an individual trip for an autonomous vehicle be enhanced or maximized, subject to other constraints.

Routing goals may be specific or general in terms of both the vehicles they are applied to and over what timeframe they are applied. As an example of routing goal specificity in vehicles, a routing goal may apply only to a specific vehicle, or to all vehicles in a specific region, or to all vehicles of a specific type, etc. Routing goal timeframe may affect both when the goal is applied (e.g., some goals may be 'active' only during set times) and how the goal is evaluated (e.g., for a longer-term goal, it may be acceptable to make some decisions that do not optimize for the goal in the short term, but may aid the goal in the long term). Likewise, routing vehicle specificity may also affect how the goal is evaluated; e.g., decisions not optimizing for a goal may be acceptable for some vehicles if the decisions aid optimization of the goal across an entire fleet of vehicles.

Some examples of routing goals include goals involving trip duration (either per trip, or average trip duration across some set of vehicles and/or times), physics, and/or company policies (e.g., adjusting routes chosen by users that end in lakes or the middle of intersections, refusing to take routes on highways, etc.), distance, velocity (e.g., max., min., average), source/destination (e.g., it may be optimal for vehicles to start/end up in a certain place such as in a pre-approved parking space or charging station), intended arrival time (e.g., when a user wants to arrive at a destination), duty cycle (e.g., how often a car is on an active trip vs. idle), energy consumption (e.g., gasoline or electrical energy), maintenance cost (e.g., estimated wear and tear), money earned (e.g., for vehicles used for ridehailing), person-distance (e.g., the number of people moved multiplied by the distance moved), occupancy percentage, higher confidence of arrival time, user-defined routes or waypoints, fuel status (e.g., how charged a battery is, how much gas is in the tank), passenger satisfaction (e.g., meeting goals set by or set for a passenger) or comfort goals, environmental impact, toll cost, etc. In examples where vehicle demand is important, routing goals may include attempting to address or meet vehicle demand.

Routing goals may be combined in any manner to form composite routing goals; for example, a composite routing goal may attempt to optimize a performance metric that takes as input trip duration, ridehail revenue, and energy usage and also, optimize a comfort metric. The components or inputs of a composite routing goal may be weighted differently and based on one or more routing coordinator directives and/or passenger preferences.

Likewise, routing goals may be prioritized or weighted in any manner. For example, a set of routing goals may be prioritized in one environment, while another set may be prioritized in a second environment. As a second example, a set of routing goals may be prioritized until the set reaches threshold values, after which point a second set of routing goals takes priority. Routing goals and routing goal priorities may be set by any suitable source (e.g., an autonomous vehicle routing platform, an autonomous vehicle passenger).

The routing coordinator uses maps to select an autonomous vehicle from the fleet to fulfill a ride request. In some implementations, the routing coordinator sends the selected autonomous vehicle the ride request details, including pickup location and destination location, and an onboard computer on the selected autonomous vehicle generates a route and navigates to the destination. In some implementations, the routing coordinator in the central computer 502 generates a route for each selected autonomous vehicle 510*a*-510*c*, and the routing coordinator determines a route for the autonomous vehicle 510*a*-510*c* to travel from the autonomous vehicle's current location to a first destination.

Figure 6:
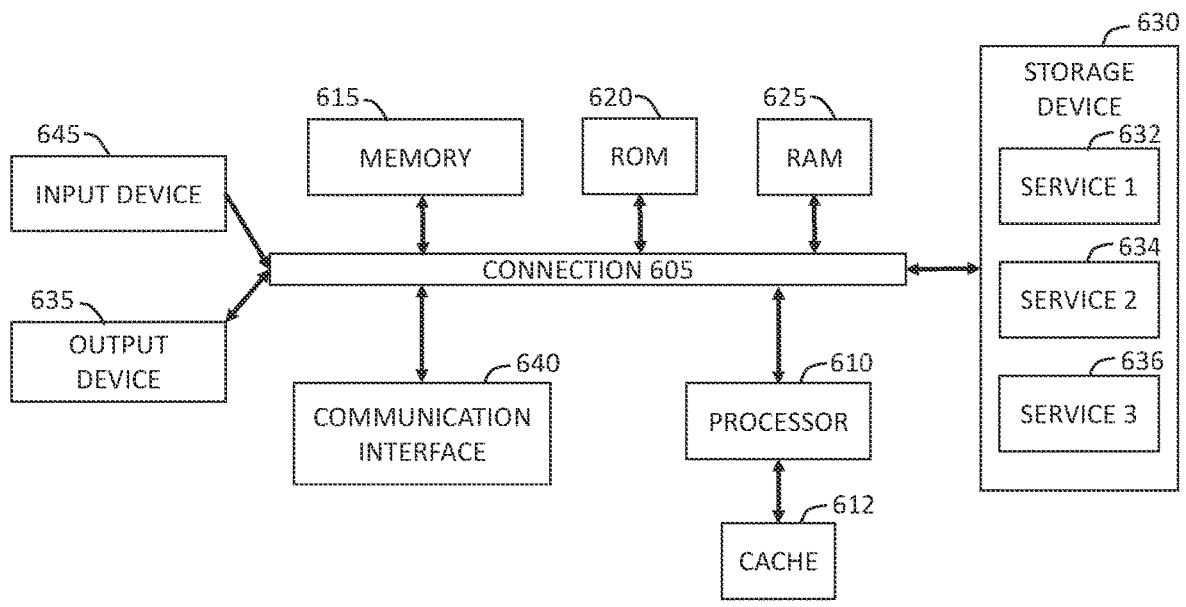
FIG. 6 shows an example embodiment of a system for implementing certain aspects of the present technology.

Example of a Computing System for Precise Pull-Over with Mechanical Simulation FIG. 6 shows an example embodiment of a computing system 600 for implementing certain aspects of the present technology. In various examples, the computing system 600 can be any computing device making up the onboard computer 104, the central computer 502, or any other computing system described herein. The computing system 600 can include any component of a computing system described herein which the components of the system are in communication with each other using connection 605. The connection 605 can be a physical connection via a bus, or a direct connection into processor 610, such as in a chipset architecture. The connection 605 can also be a virtual connection, networked connection, or logical connection.

In some implementations, the computing system 600 is a distributed system in which the functions described in this disclosure can be distributed within a datacenter, multiple data centers, a peer network, etc. In some embodiments, one or more of the described system components represents many such components each performing some or all of the functions for which the component is described. In some embodiments, the components can be physical or virtual devices. For example, the components can include a simulation system, an artificial intelligence system, a machine learning system, and/or a neural network.

The example system 600 includes at least one processing unit (central processing unit (CPU) or processor) 610 and a connection 605 that couples various system components including system memory 615, such as read-only memory (ROM) 620 and random access memory (RAM) 625 to processor 610. The computing system 600 can include a cache of high-speed memory 612 connected directly with, in close proximity to, or integrated as part of the processor 610.

The processor 610 can include any general-purpose processor and a hardware service or software service, such as services 632, 634, and 636 stored in storage device 630, configured to control the processor 610 as well as a special-purpose processor where software instructions are incorporated into the actual processor design. The processor 610 may essentially be a completely self-contained computing system, containing multiple cores or processors, a bus, memory controller, cache, etc. A multi-core processor may be symmetric or asymmetric.

To enable user interaction, the computing system 600 includes an input device 645, which can represent any number of input mechanisms, such as a microphone for speech, a touch-sensitive screen for gesture or graphical input, keyboard, mouse, motion input, speech, etc. The computing system 600 can also include an output device 635, which can be one or more of a number of output mechanisms known to those of skill in the art. In some instances, multimodal systems can enable a user to provide multiple types of input/output to communicate with the computing system 600. The computing system 600 can include a communications interface 640, which can generally govern and manage the user input and system output. There is no restriction on operating on any particular hardware arrangement, and therefore the basic features here may easily be substituted for improved hardware or firmware arrangements as they are developed.

A storage device 630 can be a non-volatile memory device and can be a hard disk or other types of computer-readable media which can store data that are accessible by a computer, such as magnetic cassettes, flash memory cards, solid state memory devices, digital versatile disks, cartridges, RAMs, ROMs, and/or some combination of these devices.

The storage device 630 can include software services, servers, services, etc., that when the code that defines such software is executed by the processor 610, it causes the system to perform a function. In some embodiments, a hardware service that performs a particular function can include the software component stored in a computer-readable medium in connection with the necessary hardware components, such as a processor 610, a connection 605, an output device 635, etc., to carry out the function.

As discussed above, each vehicle in a fleet of vehicles communicates with a routing coordinator. When a vehicle is flagged for service, the routing coordinator schedules the vehicle for service and routes the vehicle to the service center. When the vehicle is flagged for maintenance, a level of importance or immediacy of the service can be included. As such, service with a low level of immediacy will be scheduled at a convenient time for the vehicle and for the fleet of vehicles to minimize vehicle downtime and to minimize the number of vehicles removed from service at any given time. In some examples, the service is performed as part of a regularly-scheduled service. Service with a high level of immediacy may require removing vehicles from service despite an active need for the vehicles.

Routing goals may be specific or general in terms of both the vehicles they are applied to and over what timeframe they are applied. As an example of routing goal specificity in vehicles, a routing goal may apply only to a specific vehicle, or to all vehicles of a specific type, etc. Routing goal timeframe may affect both when the goal is applied (e.g., urgency of the goal, or, some goals may be 'active' only during set times) and how the goal is evaluated (e.g., for a longer-term goal, it may be acceptable to make some decisions that do not optimize for the goal in the short term, but may aid the goal in the long term). Likewise, routing vehicle specificity may also affect how the goal is evaluated; e.g., decisions not optimizing for a goal may be acceptable for some vehicles if the decisions aid optimization of the goal across an entire fleet of vehicles.

In various implementations, the routing coordinator is a remote server or a distributed computing system connected to the autonomous vehicles via an Internet connection. In some implementations, the routing coordinator is any suitable computing system. In some examples, the routing coordinator is a collection of autonomous vehicle computers working as a distributed system.

Figure 7:
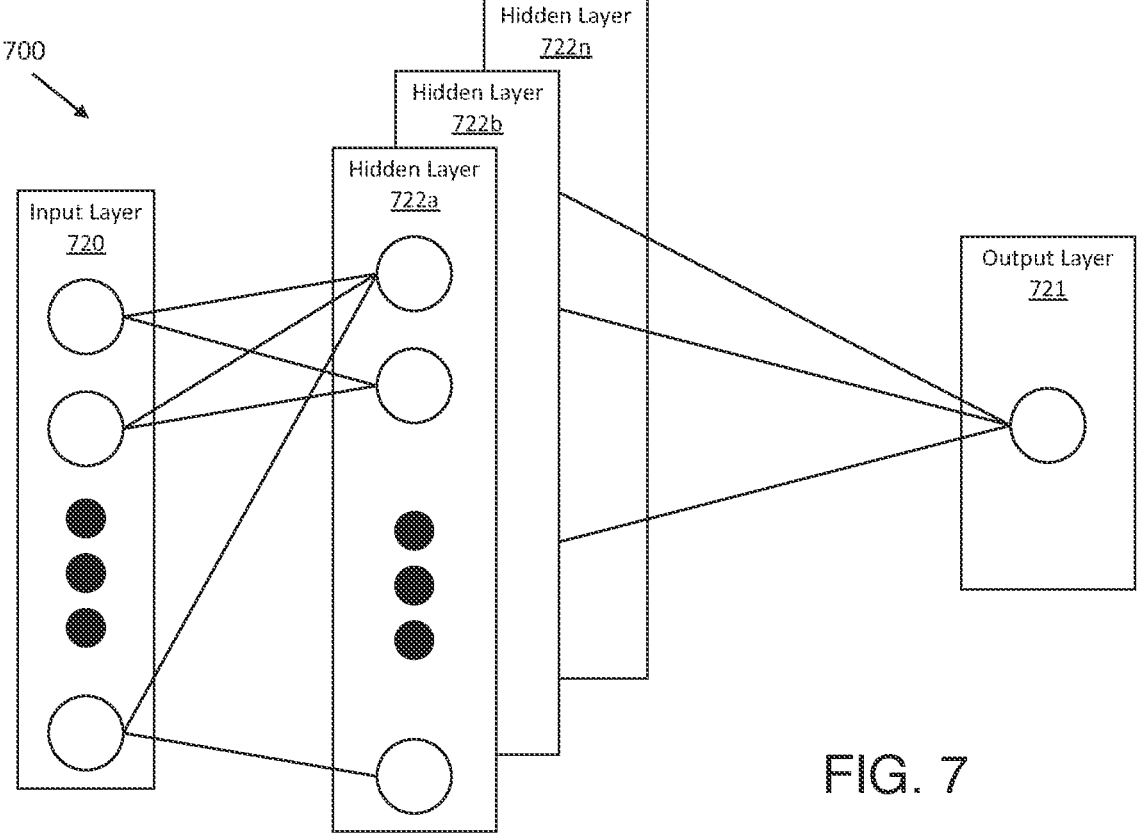
FIG. 7 illustrates an example of a deep learning neural network that can be used to implement a perception module and/or one or more validation modules, according to some aspects of the disclosed technology.

In FIG. 7, the disclosure now turns to a further discussion of models that can be used through the environments and techniques described herein. Specifically, FIG. 7 is an illustrative example of a deep learning neural network 700 that can be used to implement all or a portion of a perception module (or perception system) as discussed above. An input layer 720 can be configured to receive sensor data and/or data relating to an environment surrounding an AV. The neural network 700 includes multiple hidden layers 722a, 722b, through 722n. The hidden layers 722a, 722b, through 722n include "n" number of hidden layers, where "n" is an integer greater than or equal to one. The number of hidden layers can be made to include as many layers as needed for the given application. The neural network 700 further includes an output layer 721 that provides an output resulting from the processing performed by the hidden layers 722a, 722b, through 722n. In one illustrative example, the output layer 721 can provide estimated treatment parameters, that can be used/ingested by a differential simulator to estimate a patient treatment outcome.

The neural network 700 is a multi-layer neural network of interconnected nodes. Each node can represent a piece of information. Information associated with the nodes is shared among the different layers and each layer retains information as information is processed. In some cases, the neural network 700 can include a feed-forward network, in which case there are no feedback connections where outputs of the network are fed back into itself. In some cases, the neural network 700 can include a recurrent neural network, which can have loops that allow information to be carried across nodes while reading in input.

Information can be exchanged between nodes through node-to-node interconnections between the various layers. Nodes of the input layer 720 can activate a set of nodes in the first hidden layer 722a. For example, as shown, each of the input nodes of the input layer 720 is connected to each of the nodes of the first hidden layer 722a. The nodes of the first hidden layer 722a can transform the information of each input node by applying activation functions to the input node information. The information derived from the transformation can then be passed to and can activate the nodes of the next hidden layer 722b, which can perform their own designated functions. Example functions include convolutional, up-sampling, data transformation, and/or any other suitable functions. The output of the hidden layer 722b can then activate nodes of the next hidden layer, and so on. The output of the last hidden layer 722n can activate one or more nodes of the output layer 721, at which an output is provided. In some cases, while nodes in the neural network 700 are shown as having multiple output lines, a node can have a single output and all lines shown as being output from a node represent the same output value.

In some cases, each node or interconnection between nodes can have a weight that is a set of parameters derived from the training of the neural network 700. Once the neural network 700 is trained, it can be referred to as a trained neural network, which can be used to classify one or more activities. For example, an interconnection between nodes can represent a piece of information learned about the interconnected nodes. The interconnection can have a tunable numeric weight that can be tuned (e.g., based on a training dataset), allowing the neural network 700 to be adaptive to inputs and able to learn as more and more data is processed.

The neural network 700 is pre-trained to process the features from the data in the input layer 720 using the different hidden layers 722a, 722b, through 722n in order to provide the output through the output layer 721.

In some cases, the neural network 700 can adjust the weights of the nodes using a training process called back-propagation. A backpropagation process can include a forward pass, a loss function, a backward pass, and a weight update. The forward pass, loss function, backward pass, and parameter/weight update is performed for one training iteration. The process can be repeated for a certain number of iterations for each set of training data until the neural network 700 is trained well enough so that the weights of the layers are accurately tuned.

To perform training, a loss function can be used to analyze error in the output. Any suitable loss function definition can be used, such as a Cross-Entropy loss. Another example of a loss function includes the mean squared error (MSE), defined as $E\_total=\Sigma(\frac{1}{2}(target-output)^2)$. The loss can be set to be equal to the value of E_total.

The loss (or error) will be high for the initial training data since the actual values will be much different than the predicted output. The goal of training is to minimize the amount of loss so that the predicted output is the same as the training output. The neural network 700 can perform a backward pass by determining which inputs (weights) most contributed to the loss of the network, and can adjust the weights so that the loss decreases and is eventually minimized.

The neural network 700 can include any suitable deep network. One example includes a Convolutional Neural Network (CNN), which includes an input layer and an output layer, with multiple hidden layers between the input and out layers. The hidden layers of a CNN include a series of convolutional, nonlinear, pooling (for downsampling), and fully connected layers. The neural network 700 can include any other deep network other than a CNN, such as an autoencoder, Deep Belief Nets (DBNs), Recurrent Neural Networks (RNNs), among others.

As understood by those of skill in the art, machine-learning based classification techniques can vary depending on the desired implementation. For example, machine-learning classification schemes can utilize one or more of the following, alone or in combination: hidden Markov models; RNNs; CNNs; deep learning; Bayesian symbolic methods; Generative Adversarial Networks (GANs); support vector machines; image registration methods; and applicable rule-based systems. Where regression algorithms are used, they may include but are not limited to: a Stochastic Gradient Descent Regressor, a Passive Aggressive Regressor, etc.

Machine learning classification models can also be based on clustering algorithms (e.g., a Mini-batch K-means clustering algorithm), a recommendation algorithm (e.g., a Min-wise Hashing algorithm, or Euclidean Locality-Sensitive Hashing (LSH) algorithm), and/or an anomaly detection algorithm, such as a local outlier factor. Additionally, machine-learning models can employ a dimensionality reduction approach, such as, one or more of: a Mini-batch Dictionary Learning algorithm, an incremental Principal Component Analysis (PCA) algorithm, a Latent Dirichlet Allocation algorithm, and/or a Mini-batch K-means algorithm, etc.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Select Examples

Example 1 provides a method for optimizing stopping location for a vehicle, comprising: identifying a stopping position for the vehicle; activating a high-definition perception system to determine relative locations of nearby objects; producing a plan for reaching the stopping position; generating a first simulation of the vehicle during a stop at the stopping position, wherein the first simulation includes a vehicle door opening; generating a second simulation of a passenger during the stop at the stopping position, wherein the second simulation includes at least one of the passenger entering the vehicle through the vehicle door and the passenger exiting the vehicle through the vehicle door; and determining a score for the plan based on the first and second simulations.

Example 2 provides a method, system, and/or vehicle according to one or more of the preceding and/or following examples, wherein the plan is a first plan and the score is a first score, and further comprising: producing a second plan for reaching the stopping position; generating a third simulation of the vehicle during a stop at the stopping position; generating a fourth simulation of the passenger during a stop at the stopping position; and determining a second score for the second plan based on the third and fourth simulations.

Example 3 provides a method, system, and/or vehicle according to one or more of the preceding and/or following examples, further comprising comparing the first and second scores and identifying a selected plan of the first and second plans based on the first and second scores.

Example 4 provides a method, system, and/or vehicle according to one or more of the preceding and/or following examples, further comprising presenting the selected plan to the passenger, receiving passenger approval of the selected plan, and operating based on the selected plan.

Example 5 provides a method, system, and/or vehicle according to one or more of the preceding and/or following examples, further comprising presenting the selected plan to the passenger, receiving passenger rejection of the selected plan, and identifying a different plan of the first and second plans.

Example 6 provides a method, system, and/or vehicle according to one or more of the preceding and/or following examples, wherein activating the high-definition perception system includes generating a high-definition model of the nearby objects.

Example 7 provides a method, system, and/or vehicle according to one or more of the preceding and/or following examples, wherein generating the high-definition model includes producing a three-dimensional cloud of points and producing semantic information for the three-dimensional cloud of points.

Example 8 provides a method, system, and/or vehicle according to one or more of the preceding and/or following examples, wherein generating the high-definition model includes producing a three-dimensional depth image.

Example 9 provides a method, system, and/or vehicle according to one or more of the preceding and/or following examples, further comprising collecting temporal data and enhancing the three-dimensional depth image using the temporal data.

Example 10 provides a method, system, and/or vehicle according to one or more of the preceding and/or following examples, wherein activating the high-definition perception system includes activating short-range sensors.

Example 11 provides a method, system, and/or vehicle according to one or more of the preceding and/or following examples, wherein generating the first simulation further includes simulating the vehicle decelerating towards the stopping location.

Example 12 provides a system for optimizing vehicle stopping location, comprising: a central computer to transmit map data; and a vehicle including: a sensor suite including external vehicle sensors to sense a vehicle environment and generate sensor data; a high-definition perception system to determine relative locations of nearby objects; an onboard computer to receive map data from the central computer, to identify a stopping position for the vehicle, and to generate a plan for the vehicle to drive to the stopping position, wherein the plan is based in part on the relative locations of nearby objects; and a simulation system to: generate a first simulation of the vehicle during a stop at the stopping position, wherein the first simulation includes a vehicle door opening; generate a second simulation of a passenger during the stop at the stopping position; and wherein the onboard computer is to determine a score for the plan based on the first and second simulations.

Example 13 provides a method, system, and/or vehicle according to one or more of the preceding and/or following examples, wherein the high-definition perception system includes short-range sensors.

Example 14 provides a method, system, and/or vehicle according to one or more of the preceding and/or following examples, wherein the short-range sensors are ultrasound sensors.

Example 15 provides a method, system, and/or vehicle according to one or more of the preceding and/or following examples, wherein the high-definition perception system is to generate a high accuracy short-range vehicle-relative map including a high-definition model of the nearby objects and wherein the simulation system is to use the high accuracy short-range vehicle-relative map and the high-definition model to generate the first and second simulations.

Example 16 provides a method, system, and/or vehicle according to one or more of the preceding and/or following examples, wherein activating the high-definition perception system includes generating a high-definition model of the nearby objects.

Example 17 provides a method, system, and/or vehicle according to one or more of the preceding and/or following examples, wherein the high-definition perception system includes a neural network.

Example 18 provides a method for optimizing stopping location for a vehicle, comprising: identifying a stopping position for the vehicle; activating a high-definition perception system to determine relative locations of nearby objects; producing a plan for reaching the stopping position; generating a first simulation of the vehicle during a stop at the stopping position, wherein the first simulation includes a vehicle door opening; generating a second simulation of a user during a stop at the stopping position, wherein the second simulation includes at least one of the user opening the vehicle door to drop off a delivery and the user opening the vehicle door to pick up a delivery; and determining a score for the plan based on the first and second simulations.

Example 19 provides a method, system, and/or vehicle according to one or more of the preceding and/or following examples, wherein the plan is a first plan and the score is a first score, and further comprising: producing a second plan for reaching the stopping position; generating a third simulation of the vehicle during a stop at the stopping position; generating a fourth simulation of the user during a stop at the stopping position; and determining a second score for the second plan based on the third and fourth simulations.

Example 20 provides a method, system, and/or vehicle according to one or more of the preceding and/or following examples, further comprising comparing the first and second scores and identifying a selected plan of the first and second plans based on the first and second scores.

Example 21 provides a method, system, and/or vehicle according to one or more of the preceding and/or following examples, further comprising determining, using a neural network, relative locations of nearby objects.

Example 22 provides a method for optimizing stopping location for a vehicle comprising determining, using a neural network, relative locations of nearby objects; identifying a stopping position for the vehicle; and performing a mechanical simulation of the vehicle during a stop at the stopping position using a high accuracy short-range vehicle-relative map.

Example 23 provides a method, system, and/or vehicle according to one or more of the preceding and/or following examples, wherein determining relative locations of nearby objects includes producing pixel-by-pixel information.

Example 24 provides a method, system, and/or vehicle according to one or more of the preceding and/or following examples, wherein determining relative locations of nearby objects includes using short-range sensors.

Example 25 provides a method, system, and/or vehicle according to one or more of the preceding and/or following examples, wherein the short-range sensors are ultrasound sensors.

Example 26 provides a method, system, and/or vehicle according to one or more of the preceding and/or following examples, further comprising using sensor fusion to calibrate shapes to ultrasound.

Example 27 provides a method for optimizing stopping location for a vehicle, comprising: identifying a stopping position for the vehicle; activating a perception system to determine relative locations of nearby objects; generating a first simulation of the vehicle during a stop at the stopping position, wherein the first simulation includes a first vehicle door opening and one of a user entering the vehicle through the first vehicle door and the user exiting the vehicle through the first vehicle door; generating a second simulation of the vehicle during the stop at the stopping position, wherein the second simulation includes a second vehicle door opening and one of the user entering the vehicle through the second vehicle door and the user exiting the vehicle through the second vehicle door; and determining a first score for the first simulation and a second score for the second simulation.

Example 28 provides a method, system, and/or vehicle according to one or more of the preceding and/or following examples, further comprising comparing the first and second scores and identifying a selected plan for the user based on the first and second scores.

Example 29 provides a method, system, and/or vehicle according to one or more of the preceding and/or following examples, wherein the first and second vehicle doors are on opposite sides of the vehicle.

Example 30 provides a method, system, and/or vehicle according to one or more of the preceding and/or following examples, further comprising presenting the selected plan to the passenger, receiving passenger feedback, and operating based on the feedback.

Example 31 provides a method, system, and/or vehicle according to one or more of the preceding and/or following examples, wherein activating the perception system includes activating a deep learning module configured to optimize stopping location.

Example 32 provides a method, system, and/or vehicle according to one or more of the preceding and/or following examples, wherein activating the perception system includes activating a second deep learning module different from a first deep learning module used during normal vehicle operation.

Variations and Implementations

According to various examples, driving behavior includes any information relating to how an autonomous vehicle drives. For example, driving behavior includes how and when the autonomous vehicle actuates its brakes and its accelerator, and how it steers. In particular, the autonomous vehicle is given a set of instructions (e.g., a route or plan), and the driving behavior determines how the set of instructions is implemented to drive the car to and from various destinations, and, potentially, to stop for passengers or items. Driving behavior may include a description of a controlled operation and movement of an autonomous vehicle and the manner in which the autonomous vehicle applies traffic rules during one or more driving sessions. Driving behavior may additionally or alternatively include any information about how an autonomous vehicle calculates routes (e.g., prioritizing fastest time vs. shortest distance), other autonomous vehicle actuation behavior (e.g., actuation of lights, windshield wipers, traction control settings, etc.) and/or how an autonomous vehicle responds to environmental stimulus (e.g., how an autonomous vehicle behaves if it is raining, or if an animal jumps in front of the vehicle). Some examples of elements that may contribute to driving behavior include acceleration constraints, deceleration constraints, speed constraints, steering constraints, suspension settings, routing preferences (e.g., scenic routes, faster routes, no highways), lighting preferences, action profiles (e.g., how a vehicle turns, changes lanes, or performs a driving maneuver), and action frequency constraints (e.g., how often a vehicle changes lanes). Additionally, driving behavior includes information relating to whether the autonomous vehicle drives and/or parks.

As will be appreciated by one skilled in the art, aspects of the present disclosure, may be embodied in various manners (e.g., as a method, a system, a computer program product, or a computer-readable storage medium). Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, or one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing perception system devices and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims and/or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The preceding disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting.

Other features and advantages of the disclosure will be apparent from the description and the claims. Note that all optional features of the apparatus described above may also be implemented with respect to the method or process described herein and specifics in the examples may be used anywhere in one or more embodiments.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A method for optimizing stopping location for a vehicle, comprising: identifying a stopping position for the vehicle;

activating a perception system to determine relative locations of nearby objects;

identifying a plan for reaching the stopping position;

generating a first simulation of the vehicle during a stop at the stopping position, wherein the first simulation includes a vehicle door opening;

generating a second simulation of a passenger during the stop at the stopping position, wherein the second simulation includes at least one of: the passenger entering the vehicle through the vehicle door, and the passenger exiting the vehicle through the vehicle door;

determining a score for the plan based on the first and second simulations;

identifying a second plan for reaching the stopping position; generating a third simulation of the vehicle during a stop at the stopping position;

generating a fourth simulation of the passenger during a stop at the stopping position;

determining a second score for the second plan based on the third and fourth simulations; and operating the vehicle according to a selected one of the first plan and the second plan.

2. The method of claim 1, further comprising comparing the first and second scores and identifying a selected plan of the first and second plans based on the first and second scores.

3. The method of claim 2, further comprising presenting the selected plan to the passenger, receiving passenger feedback, and operating based on the feedback.

4. The method of claim 3, wherein the passenger feedback comprises one of: approval of the selected plan, rejection of the selected plan, and requesting another plan.

5. The method of claim 2, further comprising presenting the selected plan to the passenger, receiving passenger rejection of the selected plan, and identifying a different plan of the first and second plans.

6. The method of claim 1, wherein activating the perception system includes generating a high-definition model of the nearby objects.

7. The method of claim 6, wherein generating the high-definition model includes producing a three-dimensional cloud of points and producing semantic information for the three-dimensional cloud of points.

8. The method of claim 6, wherein generating the high-definition model includes producing a three-dimensional depth image.

9. The method of claim 8, further comprising collecting temporal data and enhancing the three-dimensional depth image using the temporal data.

10. The method of claim 6, wherein activating the perception system includes activating short-range sensors.

11. The method of claim 1, wherein activating the perception system includes activating a deep learning module configured to optimize stopping location.

12. The method of claim 1, wherein generating the first simulation further includes simulating the vehicle decelerating towards the stopping location.

13. A system for optimizing vehicle stopping location, comprising: a central computer to transmit map data; and a vehicle including:

a sensor suite including external vehicle sensors to sense a vehicle environment and generate sensor data;

a perception system to determine relative locations of nearby objects;

an on board computer to receive map data from the central computer, to identify a stopping position for the vehicle, and to identify a first plan for the vehicle to drive to the stopping position, wherein the first plan is based in part on the relative locations of nearby objects; and a simulation system to:

generate a first simulation of the vehicle during a stop at the stopping position, wherein the first simulation includes a vehicle door opening;

generate a second simulation of a passenger during the stop at the stopping position; and wherein the onboard computer is to determine a score for the first plan based on the first and second simulations; identify a second plan for reaching the stopping position; generate a third simulation of the vehicle during a stop at the stopping position;

generate a fourth simulation of the passenger during a stop at the stopping position; and determine a second score for the second plan based on the third and fourth simulations;

wherein the vehicle is operated according to a selected one of the first plan and the second plan.

14. The system of claim 13, wherein the perception system includes short-range sensors.

15. The system of claim 14, wherein the short-range sensors are one of ultrasound sensors and surround cameras.

16. The system of claim 13, wherein the perception system is to generate a high accuracy short-range vehicle-relative map including a high-definition model of the nearby objects and wherein the simulation system is to use the high accuracy short-range vehicle-relative map and the high-definition model to generate the first and second simulations.

17. The system of claim 16, wherein activating the perception system includes generating a high-definition model of the nearby objects.

18. A method for optimizing stopping location for a vehicle, comprising:

identifying a first plan for reaching a stopping position for the vehicle;

activating a perception system to determine relative locations of nearby objects;

generating a first simulation of the vehicle during a stop at the stopping position, wherein the first simulation includes a first vehicle door opening and one of a user entering the vehicle through the first vehicle door and the user exiting the vehicle through the first vehicle door;

generating a second simulation of the vehicle during the stop at the stopping position, wherein the second simulation includes a second vehicle door opening and one of the user entering the vehicle through the second vehicle door and the user exiting the vehicle through the second vehicle door;

determining a first score for the first simulation and a second score for the second simulation;

identifying a second plan for reaching the stopping position;

generating a third simulation of the vehicle during a stop at the stopping position;

generating a fourth simulation of the passenger during a stop at the stopping position;

determining a second score for the second plan based on the third and fourth simulations; and operating the vehicle according to a selected one of the first plan and the second plan.

19. The method of claim 18, further comprising comparing the first and second scores and identifying a selected plan for the user based on the first and second scores.

* * * * *